United States Patent
Kido et al.

(10) Patent No.: US 12,409,499 B2
(45) Date of Patent: Sep. 9, 2025

(54) CEMENTED CARBIDE AND CUTTING TOOL USING THE SAME

(71) Applicant: Sumitomo Electric Industries, Ltd., Osaka (JP)

(72) Inventors: Yasuki Kido, Osaka (JP); Yoshihiro Kimura, Osaka (JP); Anongsack Paseuth, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/844,987

(22) PCT Filed: Feb. 7, 2023

(86) PCT No.: PCT/JP2023/003932
§ 371 (c)(1),
(2) Date: Sep. 9, 2024

(87) PCT Pub. No.: WO2024/166195
PCT Pub. Date: Aug. 15, 2024

(65) Prior Publication Data
US 2025/0100057 A1    Mar. 27, 2025

(51) Int. Cl.
*B23B 51/02*    (2006.01)
*C22C 1/051*    (2023.01)
*C22C 29/08*    (2006.01)

(52) U.S. Cl.
CPC .............. *B23B 51/02* (2013.01); *C22C 1/051* (2013.01); *C22C 29/08* (2013.01); *B23B 2222/28* (2013.01)

(58) Field of Classification Search
CPC ..................................................... C22C 1/051
See application file for complete search history.

(56) References Cited

U.S. PATENT DOCUMENTS

| 2018/0222804 A1* | 8/2018 | Kido ................. C04B 35/62635 |
| 2019/0022763 A1 | 1/2019 | Tanaka et al. |
| 2022/0048213 A1 | 2/2022 | Hamaki et al. |

FOREIGN PATENT DOCUMENTS

| CN | 110168121 A | 8/2019 |
| CN | 110651056 A | 1/2020 |

(Continued)

OTHER PUBLICATIONS

Decision to Grant mailed on May 7, 2024, received for JP Application 2023-546138, 5 pages including English Translation.

*Primary Examiner* — Sally A Merkling
*Assistant Examiner* — Sean P. O'Keefe
(74) *Attorney, Agent, or Firm* — XSENSUS LLP

(57) ABSTRACT

A cemented carbide comprising a plurality of tungsten carbide particles and a binder phase, wherein the cemented carbide comprises a total of 80% by volume or more of the tungsten carbide particles and the binder phase, the cemented carbide comprises 0.1% by volume or more and 20% by volume or less of the binder phase, the cemented carbide comprises at least one first element selected from the group consisting of titanium, tantalum, niobium, zirconium, hafnium, and molybdenum, the cemented carbide comprises a total of 0.01 atomic % or more and 10.0 atomic % or less of the first element, the binder phase comprises 50% by mass or more of cobalt, and the first element is not segregated in a first interface region between the tungsten carbide particles adjacent to each other.

6 Claims, 3 Drawing Sheets

(56) References Cited

FOREIGN PATENT DOCUMENTS

| | | |
|---|---|---|
| CN | 111378857 A | 7/2020 |
| CN | 113166862 A | 7/2021 |
| EP | 3309268 B1 | 7/2020 |
| EP | 4372115 A1 | 5/2024 |
| JP | H07-100701 A | 4/1995 |
| JP | 2004-230481 A | 8/2004 |
| JP | 2012-162753 A | 8/2012 |
| JP | 2016-098393 A | 5/2016 |
| JP | 6459106 B1 | 1/2019 |
| JP | 2021-085052 A | 6/2021 |
| JP | 2021-110010 A | 8/2021 |
| JP | 7401048 B1 | 12/2023 |
| WO | 2018/105403 A1 | 6/2018 |
| WO | 2019/123764 A1 | 6/2019 |
| WO | 2021/106276 A1 | 6/2021 |
| WO | 2023/228328 A | 11/2023 |

* cited by examiner

CEMENTED CARBIDE AND CUTTING TOOL USING THE SAME

CROSS-REFERENCE TO RELATED APPLICATION

The present application is based on PCT/JP2023/003932, filed Feb. 7, 2023, the entire contents of which are incorporated herein by reference.

TECHNICAL FIELD

The present disclosure relates to a cemented carbide and a cutting tool using the same.

BACKGROUND ART

Conventionally, a cemented carbide including a tungsten carbide (WC) particle and a binder phase including cobalt as a main component has been used as a material for a cutting tool (PTL 1 and PTL 2).

CITATION LIST

Patent Literature

PTL 1: Japanese Patent Laying-Open No. 2016-098393
PTL 2: Japanese Patent Laying-Open No. 2021-110010

SUMMARY OF INVENTION

The cemented carbide according to the present disclosure is a cemented carbide comprising a plurality of tungsten carbide particles and a binder phase, wherein
the cemented carbide comprises a total of 80% by volume or more of the tungsten carbide particles and the binder phase,
the cemented carbide comprises 0.1% by volume or more and 20% by volume or less of the binder phase,
the cemented carbide comprises at least one first element selected from the group consisting of titanium, tantalum, niobium, zirconium, hafnium, and molybdenum,
the cemented carbide comprises a total of 0.01 atomic % or more and 10.0 atomic % or less of the first element,
the binder phase comprises 50% by mass or more of cobalt, and
the first element is not segregated in a first interface region between the tungsten carbide particles adjacent to each other.

DETAILED DESCRIPTION

Figure 1:
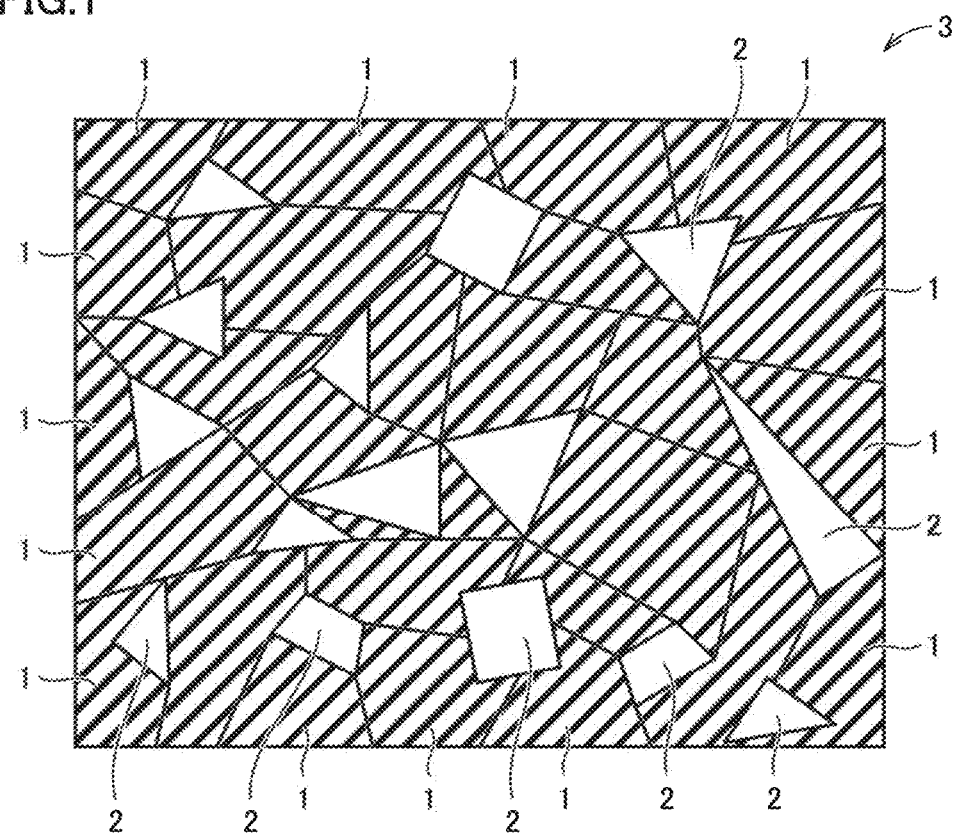
FIG. 1 is a schematic cross-sectional view of a cemented carbide according to Embodiment 1.

Problem to be Solved by the Present Disclosure

In recent years, with the expansion of 5G (5th generation mobile communication system), the capacity of information has continued to increase, and printed circuit hoards have been required to have a further heat resistance. In order to improve the heat resistance of the printed circuit board, techniques that improve the heat resistance of resins or glass fillers constituting the printed circuit board have been developed. On the other hand, this increasingly makes it difficult to cut the printed circuit boards. Even when used for such a material for a cutting tool for drill working of a printed circuit board, a cemented carbide that can prolong a life of a cutting tool is required.

Therefore, an object of the present disclosure is to provide a cemented carbide that can prolong a life of a tool, particularly even when used as a material for a cutting tool for drill working of a printed circuit board, and a cutting tool including the same.

Advantageous Effect of the Present Disclosure

According to the present disclosure, it is possible to provide a cemented carbide that can prolong the tool life, particularly even when used as a material for a cutting tool for drill working of a printed circuit board, and a cutting tool including the some.

DESCRIPTION OF EMBODIMENTS

First, aspects of the present disclosure will be listed and described.

(1) The cemented carbide according to the present disclosure is a cemented carbide comprising a plurality of tungsten carbide particles and a binder phase, wherein
the cemented carbide comprises a total of 80% by volume or more of the tungsten carbide particles and the binder phase,
the cemented carbide comprises 0.1% by volume or more and 20% by volume or less of the binder phase,
the cemented carbide comprises at least one first element selected from the group consisting of titanium, tantalum, niobium, zirconium, hafnium, and molybdenum,
the cemented carbide comprises a total of 0.01 atomic % or more and 10.0 atomic % or less of the first element,
the binder phase comprises 50% by mass or more of cobalt, and
the first element is not segregated in a first interface region between the tungsten carbide particles adjacent to each other.

According to the present disclosure, it is possible to provide a cemented carbide that can prolong the tool life, particularly even when used as a material for a cutting tool for drill working of a printed circuit board, and a cutting tool including the same.

(2) In (1) above, the total content of the first element in the cemented carbide may be 0.1 atomic % or more and 5 atomic % or less. According to this, the tool life is further improved.

(3) In (1) or (2) above, the cemented carbide may include 18% by volume or less of the binder phase. According to this, the tool life is further improved.

(4) In any of (1) to (3) above, a first tungsten carbide particle and a second tungsten carbide particle that are the tungsten carbide particles adjacent to each other form a first interface, and
the first interface region consists of a first A region in which a distance from the first interface approaching the first tungsten carbide particle is within 1.2 nm, and a first B region in which a distance from the first interface approaching the second tungsten carbide particle is within 1.2 nm.

(5) The cutting tool according to the present disclosure is a cutting tool comprising a cutting edge formed from the cemented carbide according to any of (1) to (4) above.

The cutting tool according to the present disclosure can have a long tool life, particularly even when used for drill working of a printed circuit board.

DETAILS OF THE EMBODIMENTS OF THE PRESENT DISCLOSURE

With reference to the drawings, specific examples of the cemented carbide and the cutting tool according to the present disclosure will be described below. In the drawings of the present disclosure, the same reference signs represent the same portions or equivalent portions. In addition, a dimensional relationship such as length, width, thickness, or depth is appropriately changed for clarity and simplification of the drawings, and does not necessarily represent an actual dimensional relationship.

As used in the present disclosure, the expression of a range in the format "A to B" means the upper limit and the lower limit of the range (that is, A or more and B or less), and when no unit is written in A and a unit is only written in B, the unit for A and the unit for B are the same.

As used in the present disclosure, when a compound or the like is represented by a chemical formula, if the atomic ratio is not particularly limited, the chemical formula shall include all conventionally known atomic ratios, and should not necessarily be limited only to those within the stoichiometric range.

As used in the present disclosure, when one or more numerical values are written as each of the lower limit and the upper limit of a numerical range, a combination of any one numerical value written as the lower limit and any one numerical value written as the upper limit shall also be disclosed. For example, when a1 or more, b1 or more, and c1 or more are written as the lower limit, and a2 or less, b2 or less, and c2 or less are written as the upper limit, a1 or more and a2 or less, a1 or more and b2 or less, a1 or more and c2 or less, b1 or more and a2 or less, b1 or more and b2 or less, b1 or more and c2 or less, c1 or more and a2 or less, c1 or more and b2 or less, and c1 or more and c2 or less shall be disclosed.

Embodiment 1: Cemented Carbide

The cemented carbide according to one embodiment of the present disclosure (hereinafter also referred to as "Embodiment 1") is a cemented carbide comprising a plurality of tungsten carbide particles and a binder phase, wherein
the cemented carbide comprises a total of 80% by volume or more of the tungsten carbide particles and the binder phase,
the cemented carbide comprises 0.1% by volume or more and 20% by volume or less of the binder phase,
the cemented carbide comprises at least one first element selected from the group consisting of titanium, tantalum, niobium, zirconium, hafnium, and molybdenum,
the cemented carbide comprises a total of 0.01 atomic % or more and 10.0 atomic % or less of the first element,
the binder phase comprises 50% by mass or more of cobalt, and
the first element is not segregated in a first interface region between the tungsten carbide particles adjacent to each other.

The cemented carbide of Embodiment 1 can provide a cemented carbide that can prolong the tool life, particularly even when used as a material for a cutting tool for drill working of a printed circuit board, and a cutting tool including the same. Although the reason for this is not clear, it is presumed as follows.

The cemented carbide of Embodiment 1 includes a plurality of tungsten carbide particles (hereinafter also referred to as "WC particles") and a binder phase, and the total content of the WC particles and binder phase in the cemented carbide is 80% by volume or more. According to this, the cemented carbide has high hardness and strength, and a cutting tool using the cemented carbide can have excellent wear resistance and breakage resistance.

The cemented carbide of Embodiment 1 includes 0.1% by volume or more and 20% by volume or less of the binder phase, and the binder phase includes 50% by mass or more of cobalt. According to this, the cemented carbide has high hardness and strength, and a cutting tool using the cemented carbide can have excellent wear resistance and breakage resistance.

The cemented carbide of Embodiment 1 includes at least one first element selected from the group consisting of titanium, tantalum, niobium, zirconium, hafnium, and molybdenum, and the cemented carbide includes a total of 0.01 atomic % or more and 10.0 atomic % or less of the first element. According to this, the heat resistance, the reaction resistance, and the like of the cemented carbide are improved.

In the cemented carbide of Embodiment 1, the first element is not segregated in a first interface region between the tungsten carbide particles adjacent to each other. According to this, in the cemented carbide, the interface strength between the tungsten carbide particles is improved, and falling-off of the tungsten carbide particles is suppressed during cutting working. Therefore, a cutting tool using the cemented carbide as a material can have a long tool life. Further, the cutting tool also has improved hole position accuracy.

<Composition of Cemented Carbide>

As shown in FIG. 1, a cemented carbide 3 of Embodiment 1 includes a plurality of tungsten carbide particles 1 (hereinafter also referred to as "WC particles") and a binder phase 2, wherein the total content of the WC particles and the binder phase in cemented carbide 3 is 80% by volume or more. The lower limit of the total content of the WC particles and the binder phase in the cemented carbide may be 82% by volume or more, 84% by volume or more, 85% by volume or more, or 86% by volume or more. The upper limit of the total content of the WC particles and the binder phase in the cemented carbide may be 100% by volume or less. The upper limit of the total content of the WC particles and the binder phase in the cemented carbide may be 99% by volume or less, or 98% by volume or less, from the viewpoint of manufacturing. In the cemented carbide, the total content of the WC particles and the binder phase in the cemented carbide may be 80% by volume or more and 100% by volume or less, 82% by volume or more and 100% by volume or less, or 84% by volume or more and 100% by volume or less.

The cemented carbide of Embodiment 1 can consist of a plurality of tungsten carbide particles and a binder phase. The cemented carbide of the present embodiment can include a different phase in addition to the tungsten carbide particles and the binder phase. Examples of the different phase include a carbide, nitride, or a carbonitride containing at least one first element selected from the group consisting of titanium (Ti), tantalum (Ta), niobium (Nb), zirconium (Zr), hafnium (Hf), and molybdenum (Mo). The composition of the different phase is, for example, TiCN, TaC, NbC, ZrC, Hft, $Mo_2C$.

The cemented carbide of Embodiment 1 can consist of the tungsten carbide particles, the binder phase, and a different phase. Any content of the different phase in the cemented carbide is allowed as long as it does not impair the effect of the present disclosure. For example, the content of the different phase in the cemented carbide may be more than 0% by volume and 20% by volume or less, more than 0% by volume and 18% by volume or less, or more than 0% by volume and 16% by volume or less. In this case, the total content of the WC particles and the binder phase in the cemented carbide may be 80% by volume or more and less than 100% by volume, 82% by volume or more and less than 100% by volume, or 84% by volume or more and less than 100% by volume.

The cemented carbide of Embodiment 1 can include an impurity. Examples of the impurity include iron (Fe), calcium (Ca), silicon (Si), and sulfur (S). Any content of the impurity in the cemented carbide is allowed as long as it does not impair the effect of the present disclosure. For example, the content of the impurity in the cemented carbide is preferably 0% by mass or more and less than 0.1% by mass. The content of the impurity in the cemented carbide is measured by ICP emission spectroscopy (Inductively Coupled Plasma Emission Spectroscopy (measuring apparatus: "ICPS-8100" (trademark) of Shimadzu Corporation)).

The lower limit of the content of the tungsten carbide particles in the cemented carbide of Embodiment 1 may be 60% by volume or more, 62% by volume or more, 64% by volume or more, or 68% by volume or more. The upper limit of the content of the tungsten carbide particles in the cemented carbide may be 99.9% by volume or less, 99.2% by volume or less, 99% by volume or less, 98% by volume or less, 97% by volume or less, or 90% by volume or less. The content of the tungsten carbide particles in the cemented carbide may be 60% by volume or more and 99.9% by volume or less, 60% by volume or more and 99.2% by volume or less, 64% by volume or more and 97% by volume or less, or 68% by volume or more and 90% by volume or less.

The cemented carbide of Embodiment 1 includes 0.1% by volume or more and 20% by volume or less of the binder phase. From the viewpoint of improving toughness, the lower limit of the content of the binder phase in the cemented carbide is 0.1% by volume or more, and may be 0.4% by volume or more, 1% by volume or more, 1.5% by volume or more, 2% by volume or more, 3% by volume or more, or 8% by volume or more. From the viewpoint of improving hardness, the upper limit of the content of the binder phase in the cemented carbide is 20% by volume or less, and may be 18% by volume or less, 16% by volume or less, or 15% by volume or less. The content of the binder phase in the cemented carbide may be 0.1% by volume or more and 18% by volume or less, 0.4% by volume or more and 18% by volume or less, 1.5% by volume or more and 16% by volume or less, or 8% by volume or more and 14% by volume or less. When the content of the binder phase in the cemented carbide is 18% by volume or less, the hardness of the cemented carbide is further improved, and the wear resistance is further improved, and thus the tool life of a cutting tool using the cemented carbide as a material is further improved. The Rockwell hardness (HRC) of the cemented carbide of the present embodiment may be, for example, 90 or more and 95 or less, or 91 or more and 95 or less.

The method for measuring the content (% by volume) of the tungsten carbide particles in the cemented carbide and the content (% by volume) of the binder phase in the cemented carbide is as follows.

(A1) The cemented carbide is cut out at an arbitrary position to expose a cross section. The cross section is mirror-finished with a cross-section polisher (manufactured by JEOL Ltd.).

(B1) The mirror-finished surface of the cemented carbide is analyzed by using a scanning electron microscope-energy dispersive X-ray spectroscopy (SEM-EDX) (apparatus: Gemini 450 (trademark) manufactured by Carl Zeiss AG) to identify an element included in the cemented carbide.

(C1) The mirror-finished surface of the cemented carbide is photographed with a scanning electron microscope (SEM) to obtain a backscattered electron image. The photographing region of the photographed image is set to the central part of the cross section of the cemented carbide, that is, a position that does not include a portion that clearly differs in a property from a bulk portion, such as the vicinity of the surface of the cemented carbide, (a position where the entire photographing region is the bulk portion of the cemented carbide). The observation magnification is 5000 times. The measurement conditions are an acceleration voltage of 3 kV, a current value of 2 nA, and a working distance (WD) of 5 mm.

(D1) The photographing region of (C1) above is analyzed by using an energy dispersive X-ray analyzer attached to the SEM (SEM-EDX) to identify the distribution of the element identified in (B1) above in the photographing region and obtain an elemental mapping image.

(E1) The backscattered electron image obtained in (C1) above is taken into a computer and subjected to binarization processing by using image analysis software (OpenCV, SciPy). On the image after binarization processing, the tungsten carbide particles are shown in white and the binder phase is shown in gray to black. The binarization threshold varies depending on the contrast, and thus is set for each image.

(F1) The elemental mapping image obtained in (D1) above and the image after binarization processing obtained in (E1) above are superimposed to identify regions in which the tungsten carbide particles and the binder phase, respectively, are present in the image after binarization processing. Specifically, the region which is shown in white in the image after binarization processing and in which tungsten (W) and carbon (C) are present in the elemental mapping image corresponds to the region in which the tungsten carbide particles are present. The region which is shown in gray to black in the image after binarization processing and in which cobalt (Co) is present in the elemental mapping image corresponds to the region in which the binder phase is present.

(G1) One rectangular measurement field of view of 4.9 μm×18.8 μm is set in the image after binarization processing. By using the image analysis software, the area percentage of each of the tungsten carbide particles and the binder phase is measured with the area of the entire measurement field of view as the denominator.

(H1) The measurement of (G1) above is carried out in 5 different measurement fields of view that do not overlap each other. Herein, the average of the area percentages of the tungsten carbide particles in the 5 measurement fields of view corresponds to the content (% by volume) of the tungsten carbide particles in the cemented carbide, and the average of the area percentages of the binder phase in the 5 measurement fields of view corresponds to the content (% by volume) of the binder phase in the cemented carbide.

When the cemented carbide includes a different phase in addition to the WC particles and the binder phase, the content of the different phase in the cemented carbide can be obtained by subtracting the content (% by volume) of the tungsten carbide particles and the content (% by volume) of the binder phase measured by the above procedure from the entire cemented carbide (100% by volume).

As long as the applicant has carried out the measurement, it has been confirmed that as long as the measurement is carried out on the same sample, even if the cut-out location of the cross section of the cemented carbide, the photographing region described in (C1) above, and the measurement field of view described in (G1) above are arbitrarily set to measure the content of the tungsten carbide particles and the content of the binder phase in the cemented carbide a plurality of times according to the above procedure, there is little variation in the measurement results, and that even if the cut-out location of the cross section of the cemented carbide, the photographing region, and the measurement field of view are arbitrarily set, it will not be contrived.

<Tungsten Carbide Particles>

In Embodiment 1, the tungsten carbide particles include at least any of "pure WC particles (also including WC containing no impurity element and WC in which the content of an impurity element is below the detection limit)" and "WC particles inside which an impurity element is intentionally or unavoidably contained as long as the effect of the present disclosure is not impaired." The content of an impurity in the tungsten carbide particles (when two or more elements constitute the impurity, the total concentration of the elements) is less than 0.1% by mass. The content of the impurity element in the tungsten carbide particles is measured by ICP emission spectrometry.

In Embodiment 1, the average particle diameter of the tungsten carbide particles is not particularly limited. The average particle diameter of the tungsten carbide particles can be, for example, 0.1 µm or more and 3.5 µm or less. It has been confirmed that the cemented carbide of Embodiment 1 can have a long tool life regardless of the average particle diameter of the tungsten carbide particles.

<Binder Phase>

In Embodiment 1, the binder phase includes 50% by mass or more of cobalt. This can impart excellent toughness to the cemented carbide. The lower limit of the cobalt content of the binder phase may be 52% by mass or more, 60% by mass or more, 66% by mass or more, or 70% by mass or more. The upper limit of the cobalt content of the binder phase may be 100% by mass or less, less than 100% by mass, 95% by mass or less, 93% by mass or less, or 90% by mass or less. The cobalt content of the binder phase may be 50% by mass or more and less than 100% by mass, 60% by mass or more and 95% by mass or less, or 70% by mass or more and 90% by mass or less.

The method for measuring the content of cobalt in the binder phase is as follows. In the same manner as in (A1) to (F1) of the method for measuring the content of the tungsten carbide particles, the content of the binder phase, and the content of a hard phase particle in the cemented carbide, the region in which the binder phase is present is identified on an image after binarization processing. The region in which the binder phase is present is analyzed by using SEM-EDX to measure the cobalt content of the binder phase.

As long as the applicant has carried out the measurement, it has been confirmed that as long as the measurement is carried out on the same sample, even if the cut-out location of the cross section of the cemented carbide and the photographing region described in (C1) above are arbitrarily set to measure the content of cobalt in the binder phase a plurality of times according to the above procedure, there is little variation in the measurement results, and that even if the cut-out location of the cross section of the cemented carbide and the photographing region are arbitrarily set, it will not be contrived.

In Embodiment 1, the binder phase may include, in addition to cobalt, at least one first element selected from the group consisting of titanium, tantalum, niobium, zirconium, hafnium, and molybdenum. The binder phase may further include, in addition to cobalt and the first element, at least one second element selected from the group consisting of nickel (Ni), chromium (Cr), iron (Fe), aluminum (Al), ruthenium (Ru), and rhenium (Re). The binder phase can consist of cobalt and the first element. The binder phase can consist of cobalt, the first element, and the second element. The binder phase can consist of cobalt, the first element, the second element, and an unavoidable impurity. Examples of the unavoidable impurity include manganese (Mn), magnesium (Mg), calcium (Ca), and sulfur (S).

<First Element>

The cemented carbide of Embodiment 1 includes at least one first element selected from the group consisting of titanium, tantalum, niobium, zirconium, hafnium, and molybdenum, and the cemented carbide includes a total of 0.01 atomic % or more and 10 atomic % or less of the first element. From the viewpoint of improving the tool life, the lower limit of the content of the first element in the cemented carbide is 0.01 atomic % or more, and may be 0.03 atomic % or more, 0.1 atomic % or more, 0.8 atomic % or more, 1 atomic % or more, 2 atomic % or more, or 2.3 atomic % or more. From the viewpoint of maintaining strength, the upper limit of the content of the first element in the cemented carbide is 10.0 atomic % or less, and may be 9 atomic % or less, 8.2 atomic % or less, 8 atomic % or less, 7.7 atomic % or less, or 5 atomic % or less. The content of the first element in the cemented carbide may be 0.1 atomic % or more and 5 atomic % or less.

The content, based on the number of atoms, of the first element in the cemented carbide is measured by ICP (inductively Coupled Plasma) emission spectroscopy (measuring apparatus: "ICPS-8100" (trademark) of Shimadzu Corporation).

In the cemented carbide of Embodiment 1, the first element is not segregated in the first interface region between the tungsten carbide particles adjacent to each other. According to this, the interface strength between the tungsten carbide particles is improved, and the cemented carbide can have excellent wear resistance and breakage resistance.

Figure 2:
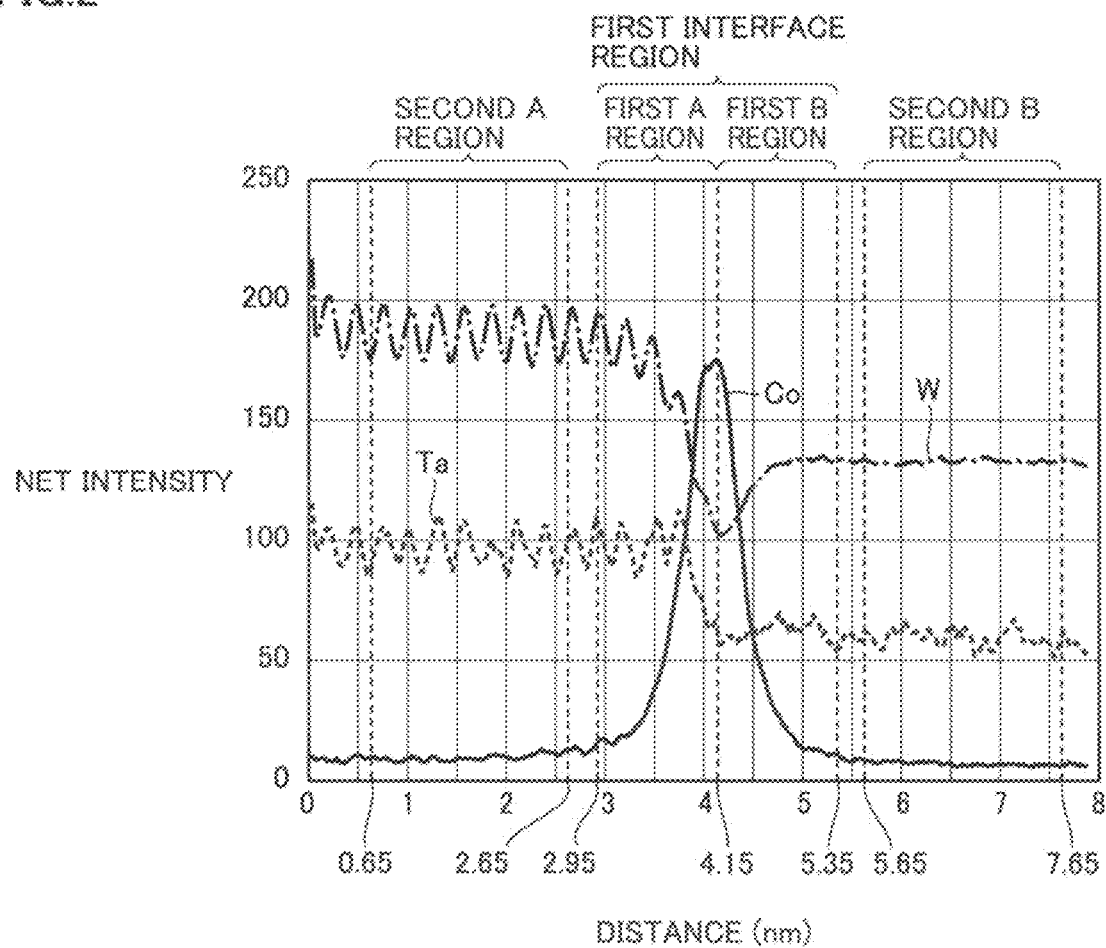
FIG. 2 is a diagram for describing a method for confirming that the first element is not segregated in the first interface region, and shows a first graph.

In the present disclosure, a method for confirming that the first element is not segregated in the first interface region between the tungsten carbide particles adjacent to each other in the cemented carbide will be described with reference to FIG. 2.

The cemented carbide is sliced into a thickness of 30 to 100 nm by using an argon ion slicer ("Cryo Ion Slicer IB-090608CIS" (trademark) manufactured by JEOL Ltd.) under conditions of an acceleration voltage of 6 kV and a finish acceleration voltage of 2 kV to make a sample for measurement. Next, the sample for measurement is observed at a magnification of 200000 times by using a TEM (Transmission Electron Microscopy) ("JEM-ARM300F2" (trademark) manufactured by JEOL Ltd.) under a condition of an acceleration voltage of 200 V to obtain a first image (not shown).

On the first image, the tungsten carbide particles are observed as white regions, the binder phase is observed as a black region, and the interface is observed as a black region. On the first image, the interface between the tungsten carbide particles is arbitrarily selected. In the present disclosure, tungsten carbide particles adjacent to each other forming an interface are also referred to as a first tungsten carbide particle and a second tungsten carbide particle.

Next, the selected interface is positioned such that it passes through the vicinity of the center of the image, the observation magnification is adjusted such that the field of view size is 5 nm×5 nm, and observation is carried out to obtain a second image (not shown). On the second image, the extension direction in which the interface extends is confirmed. Line analysis is carried out in a direction perpendicular to the extension direction and going from the first tungsten carbide particle to the second tungsten carbide particle to obtain a graph of the distributions of cobalt, tungsten, and the first element measured (hereinafter also referred to as a first graph). When the cemented carbide includes two or more types of first elements, the distribution of each element is measured. Here, the term direction perpendicular to the extension direction of the interface means the direction along a straight line that intersects the tangent to the extension direction at an angle of 90°±5°. The measurement conditions for obtaining the second image are an acceleration voltage of 200 kV, a camera length of 10 cm, a pixel count of 128-128 pixels, and a dwell time of 0.02 to 3 s/pixel, FIG. 2 is an example of the first graph. In FIG. 2, the horizontal axis (X axis) represents the distance (nm) from the measurement starting point, and the vertical axis (Y axis) represents the NET intensity (no unit). In the cemented carbide shown in FIG. 2, the first element is tantalum (Ta).

The peak position of cobalt is identified in the first graph. In the present disclosure, the peak position of cobalt is referred to as the first interface. The first interface is formed by the first tungsten carbide particle and the second tungsten carbide particle adjacent to each other. In the first graph of FIG. 2, the position of the first interface is 4.15 nm on the X axis.

In the first graph, a first A region in which the distance from the first interface approaching the first tungsten carbide particle is within 120 nm, and a first B region in which the distance from the first interface approaching the second tungsten carbide particle is within 1.20 nm are identified. In the present disclosure, the region consisting of the first A region and the first B region is the first interface region. In the first graph of FIG. 2, the position of the first interface region is 2.95 to 5.35 nm on the X axis.

In the first graph, a second A region in which the distance from the first interface approaching the first tungsten carbide particle is 1.50 nm or more and 3.50 nm or less, and a second B region in which the distance from the first interface approaching the second tungsten carbide particle is 1.50 nm or more and 3.50 nm or less are identified. In the first graph of FIG. 2, the position of the second A region is 0.65 to 2.65 nm on the X axis, and the position of the second B region is 5.65 to 7.65 nm on the X axis.

Based on the first graph, the average B of the NET intensity in a baseline region consisting of the second A region and the second B region of the first element is calculated. In the first graph, the maximum value A of the NET intensity in the first interface region of the first element is measured. When the proportion A/B of the maximum value A to the average 3 is less than 3, it is confirmed that the first element is not segregated in the first interface region between the tungsten carbide particles adjacent to each other in the cemented carbide. In the first graph of FIG. 2, the average B of the NET intensity in the baseline region consisting of the second A region and the second B region of tantalum (first element) is 78.7 (an average of NET intensities of the second A region is 97.6, and an average of NET intensities of the second B region is 59.7), and the maximum value A of the NET intensity in the first interface region of tantalum (first element) is 112.6. In the cemented carbide shown in FIG. 2, A/B is 1.43, and thus it is confirmed that the first element is not segregated in the first interface region between the tungsten carbide particles adjacent to each other in the cemented carbide.

In the cemented carbide, the first images of 5 fields of view that do not overlap each other are arbitrarily obtained, the above analysis is repeatedly carried out based on each of the first images, and when the segregation of the first element in the first interface region is not confirmed in 4 or more fields of view, it is determined that the first element is not segregated in the first interface region between the tungsten carbide particles adjacent to each other in the cemented carbide.

As long as the applicant has carried out the measurement, it has been confirmed that as long as the measurement is carried out on the same sample, even if the cut-out location of the cross section of the cemented carbide is arbitrarily set and the first image is arbitrarily obtained on the cross section to confirm the presence or absence of segregation of the first element in the first interface region multiple times by changing the line analysis region according to the above procedure, there is almost no variation in the results of the presence or absence of segregation of the first element in the first interface region. Therefore, as long as the cemented carbide is subjected to the above method for confirming the segregation of the first element and it is confirmed that the first element is not segregated in the first interface region, it is presumed that the interface strength between the tungsten carbide particles in the cemented carbide is improved.

In the cemented carbide of the present disclosure, the first element can be present in the above different phase and cobalt, <Method for Manufacturing Cemented Carbide>

The cemented carbide of the present embodiment can be manufactured by carrying out a raw material powder preparing step, a mixing step, a compacting step, a sintering step, and a cooling step in presented order. Hereinafter, each step will be described, <Preparing Step>

The preparing step is a step for preparing raw material powders of materials that constitute a cemented carbide material. Examples of the raw material powders include a tungsten carbide powder (hereinafter also referred to as a "WC powder"), a cobalt (Co) powder, and a first metal element-containing powder. Examples of the first metal element-containing powder include titanium carbonitride (TiCN) powder, tantalum carbide (TaC) powder, niobium carbide (NbC) powder, zirconium carbide (ZrC) powder, hafnium carbide (HfC) powder, and molybdenum carbide (Mo2C) powder. As these raw material powders, commercially available ones can be used. The average particle diameter of these raw material powders is not particularly limited, and can be, for example, 0.1 to 3.0 μm. The term average particle diameter of a raw material powder means the average particle diameter measured by the FSSS (Fisher Sub-Sieve Sizer) method. The average particle diameter is measured by using "Sub-Sieve Sizer Model 95" (trademark) manufactured by Fisher Scientific. The distribution of the particle diameter of the WC powder is measured by using a particle size distribution measuring apparatus (trade name: MT3300EX) manufactured by Microtrac.

<Mixing Step>

The mixing step is mixing raw material powders prepared in the preparing step at predetermined proportions. A mixed powder in which raw material powders are mixed is obtained by the mixing step. The mixing proportions of raw material powders are appropriately adjusted according to the intended composition of the cemented carbide.

For mixing the raw material powders, a conventionally known mixing method such as Atritor, a ball mill, a bead mill, and the like can be used. As the mixing conditions, conventionally known conditions can be used. For example, the mixing time can be, for example, 2 hours or more and 20 hours or less.

After the mixing step, the mixed powder may be granulated as needed. By granulating the mixed powder, it is easy to fill a die or a mold with the mixed powder during the compacting step described later. A known granulation method can be applied to the granulation, and for example, a commercially available granulator such as a spray dryer can be used.

<Compacting Step>

The compacting step is a step for compacting the mixed powder obtained in the mixing step into a shape for a cutting tool (for example, a round bar shape) to obtain a compact. As the compacting method and the compacting conditions in the compacting step, a general method and general conditions may be adopted, and these are not particularly limited.

<Sintering Step>

The sintering step is a step for obtaining a cemented carbide intermediate by sintering the compact obtained through the compacting step by a sinter HIP (Hot Isostatic Pressing) treatment that can simultaneously carry out sintering and pressurization.

The sintering step may include a first sintering step and a second sintering step. First, in the first sintering step, a sintering temperature of 1,300° C. and a sintering pressure of 7 MPa are retained for 240 minutes. Next, in the second sintering step, while the sintering pressure of 7 MPa is retained, the temperature is increased to 1,360° C., and is retained at 1,360° C. for 15 minutes. Then, a cemented carbide intermediate can be obtained.

The atmosphere at the time of sintering is not particularly limited, but NR gas atmosphere or an inert gas atmosphere such as Ar can be used.

<Cooling Step>

The cooling step is cooling the cemented carbide intermediate after the sintering step. For example, the cemented carbide can be obtained by quenching the cemented carbide intermediate in Ar gas under a condition of a pressure of 100 to 400 MPaG.

<Characteristics of Method for Manufacturing Cemented Carbide According to the Present Embodiment>

The sintering temperature of 1,300° C. in the first sintering step is lower than the sintering temperature for a general cemented carbide. Moreover, the sintering time of 240 minutes in the first sintering step is longer than the sintering time of 30 to 60 minutes for a general cemented carbide. It is presumed that this longer sintering time promotes diffusion and rearrangement of atoms at the time of sintering, and thus can provide the cemented carbide of the present disclosure in which the first element is not segregated in the first interface region between the tungsten carbide particles adjacent to each other. It has been newly found as a result of extensive studies by the present inventors that the cemented carbide of the present disclosure can be realized under such sintering conditions. Note that, the sintering temperature and the sintering time used in the first sintering step would reduce production efficiency and thus were not adopted by those skilled in the art.

Embodiment 2: Cutting Tool

The cutting tool of the present embodiment includes a cutting edge formed from the cemented carbide of Embodiment 1. In the present disclosure, the term cutting edge means a portion involved in cutting. More specifically, the term cutting edge means a region surrounded by a cutting edge ridgeline and a virtual plane having a distance of 2 mm from the cutting edge ridgeline to the cemented carbide side.

Figure 3:
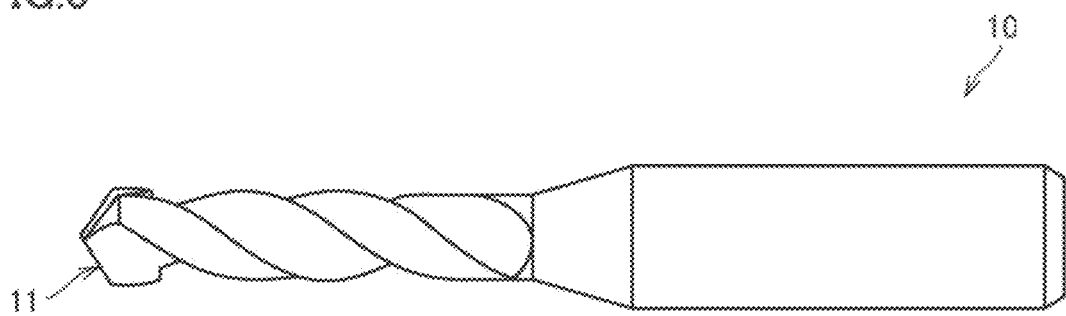
FIG. 3 is a schematic view of a cutting tool according to Embodiment 2.

Examples of the cutting tool include a cutting bit, a drill, an end mill, an indexable cutting insert for milling working, an indexable cutting insert for turning working, a metal saw, a gear cutting tool, a reamer, and a tap. In particular, as shown in FIG. 3, a cutting tool 10 of the present embodiment can exhibit an excellent effect in the case of a small-diameter drill for working a printed circuit board. A cutting edge 11 of cutting tool 10 shown in FIG. 3 is formed from the cemented carbide of Embodiment 1.

The cemented carbide of the present embodiment may constitute the whole of each of these tools, or a part thereof. Here, the term "constituting a part" refers to, for example, a mode of forming a cutting edge portion by brazing the cemented carbide of the present embodiment at a predetermined position of an arbitrary base material.

The cutting tool of the present embodiment may further include a hard film that coats at least a part of the surface of the base material formed from the cemented carbide. For example, diamond-like carbon or diamond can be used as the hard film.

The cutting tool of the present embodiment can be obtained by compacting the cemented carbide of Embodiment 1 into a desired shape.

EXAMPLES

The present embodiment will be described more specifically with reference to Examples. However, the present embodiment is not limited by these Examples.

[Making Cemented Carbide]

A cemented carbide of each sample was made by the following procedure.

A WC powder (average particle diameter of 0.3 μm) a Co powder (average particle diameter of 1.0 μm), a TiCN powder (average particle diameter of 1.0 μm), a TaC powder (average particle diameter of 1.0 μm), a NbC powder (average particle diameter of 1.0 μm), a ZrC powder (average particle diameter of 1.0 μm), a HfC powder (average particle diameter of 1.0 μm), and a $Mo_2C$ powder (average particle diameter of 1.0 μm) were prepared at the proportions described in the "Raw material powders" column of Table 1 and mixed to obtain mixed powders. For example, in sample 1, the WC powder, the Co powder, and the TiCN powder were prepared at a mass ratio of 81.8:11.7:6.5 and mixed to obtain a mixed powder. In all the samples, mixing was performed using Atritor for 10 hours.

TABLE 1

| Sample No. | WC % by mass | Co % by mass | TiCN % by mass | TaC % by mass | NbC % by mass | ZrC % by mass | HfC % by mass | Mo$_2$C % by mass |
|---|---|---|---|---|---|---|---|---|
| 1 | 81.8 | 11.7 | 6.5 | — | — | — | — | — |
| 2 | 94.0 | 3.3 | 2.8 | — | — | — | — | — |
| 3 | 91.4 | 5.2 | — | 3.4 | — | — | — | — |
| 4 | 99.1 | 0.3 | — | — | 0.7 | — | — | — |
| 5 | 88.5 | 8.5 | — | — | — | 3.1 | — | — |
| 6 | 89.6 | 10.4 | — | — | — | — | 0.01 | — |
| 7 | 87.3 | 9.8 | — | — | — | — | — | 3.0 |
| 8 | 84.5 | 6.5 | 7.9 | — | 1.1 | — | — | — |
| 9 | 91.3 | 3.9 | — | 3.3 | 1.5 | — | — | — |
| 10 | 92.6 | 1.0 | 5.9 | — | — | — | 0.6 | — |
| 11 | 83.7 | 10.4 | — | — | 5.2 | — | — | 0.7 |
| 12 | 99.92 | 0.07 | 0.01 | — | — | — | — | — |
| 13 | 75.0 | 13.0 | 12.0 | — | — | — | — | — |
| 1-1 | 79.0 | 13.7 | 7.3 | — | — | — | — | — |
| 1-2 | 91.4 | 0.0 | 8.6 | — | — | — | — | — |
| 1-3 | 89.60 | 10.40 | 0.00 | — | — | — | — | — |
| 1-4 | 80.4 | 7.2 | 12.5 | — | — | — | — | — |
| 1-5 | 88.4 | 5.2 | 6.4 | — | — | — | — | — |
| 1-6 | 89.0 | 3.3 | 7.8 | — | — | — | — | — |
| 1-7 | 81.8 | 11.7 | 6.5 | — | — | — | — | — |
| 1-8 | 81.8 | 11.7 | 6.5 | — | — | — | — | — |

Next, the mixed powders were each pressed to fabricate a round bar-shaped compact. Next, the compact was subjected to the first sintering step in an Ar gas. The temperature, the pressure, and the time in the first sintering step are as described in the column of "First sintering step" in Table 2. Then, while the pressure was retained, the temperature was changed to 1,360° C. to perform the second sintering step, thereby obtaining a cemented carbide intermediate. The retention time in the second sintering step is as described in the column of "Second sintering step" in Table 2. Next, the cemented carbide intermediate was quenched in Ar gas under a condition of a pressure of 200 MPaG to obtain the cemented carbide of each sample.

TABLE 2

| | First sintering step | | | Second sintering step |
|---|---|---|---|---|
| Sample No. | Temperature ° C. | Time Min | Pressure MPa | Retention time Min |
| 1 | 1300 | 240 | 7 | 15 |
| 2 | 1300 | 240 | 7 | 15 |
| 3 | 1300 | 240 | 7 | 15 |
| 4 | 1300 | 240 | 7 | 15 |
| 5 | 1300 | 240 | 7 | 15 |
| 6 | 1300 | 240 | 7 | 15 |
| 7 | 1300 | 240 | 7 | 15 |
| 8 | 1300 | 240 | 7 | 15 |
| 9 | 1300 | 240 | 7 | 15 |
| 10 | 1300 | 240 | 7 | 15 |
| 11 | 1300 | 240 | 7 | 15 |
| 12 | 1300 | 240 | 7 | 15 |
| 13 | 1300 | 240 | 7 | 15 |
| 1-1 | 1300 | 240 | 7 | 15 |
| 1-2 | 1300 | 240 | 7 | 15 |
| 1-3 | 1300 | 240 | 7 | 15 |
| 1-4 | 1300 | 240 | 7 | 15 |
| 1-5 | 1300 | 240 | 7 | 15 |
| 1-6 | 1380 | 240 | 7 | 15 |
| 1-7 | 1380 | 240 | 7 | 15 |
| 1-8 | 1300 | 60 | 7 | 20 |

[Fabrication of Cutting Tool]

A round bar formed from the cemented carbide obtained was worked to fabricate a drill for working a printed circuit board (PCB (Printed Circuit Board) drill) having an edge diameter of φ0.3 mm.

[Evaluation of Cemented Carbide]

<Content (% by Volume) of Tungsten Carbide Particles and Content (% by Volume) of Binder Phase in Cemented Carbide>

The content (% by volume) of the tungsten carbide particles and the content (% by volume) of the binder phase in the cemented carbide of each sample were measured, A specific measuring method is as described in Embodiment 1. Results thereof are shown in the "WC particle content" and "Binder phase content" columns of "Cemented carbide" of Table 3, Further, the sum of the content of the tungsten carbide particles and the content of the binder phase in the cemented carbide is shown in the "WC particle+binder phase content" column of "Cemented carbide" of Table 3. In Table 3, it was confirmed that the cemented carbide having a value of less than 100% by volume in the column of "WC particle+binder phase content" further includes at least one selected from the group consisting of a carbide, a nitride, and a carbonitride that contain a first element, <Cobalt Content of Binder Phase>

In the cemented carbide of each sample, the cobalt content of the binder phase was measured. A specific measuring method is as described in Embodiment 1. Results thereof are shown in the "Co content of binder phase" column of "Cemented carbide" of Table 3. It was confirmed that, in all the samples, the binder phase also includes, in addition to cobalt, the same first element as the first element described in the column of "First element type" of "Cemented carbide" in Table 3.

<Content of First Element of Cemented Carbide>

In the cemented carbide of each sample, the type of the first element included in the cemented carbide and the total content (atomic %) of the first element in the cemented carbide were measured. A specific measuring method is as described in Embodiment 1. Results thereof are shown in the "First element type" and "First element content" columns of "Cemented carbide" of Table 3, When the number of types of the first element is one, the "First element content" means the content of the one type of the first element. When the number of types of the first element is two, the "First element content" means the total content of the two types of the first element.

<Presence or Absence of Segregation of First Element in First Interface Region>

In the cemented carbide of each sample, the presence or absence of segregation of the first element in the first interface region between the tungsten carbide particles adjacent to each other was confirmed. A specific confirming method is as described in Embodiment 1. Result thereof are shown in the "Segregation of first element" column of "Cemented carbide" of Table 3.

<Rockwell Hardness>

The Rockwell hardness (HRC) of the cemented carbide of each sample was measured according to "JIS Z 2245:2016 Rockwell hardness test—test method." The measurement conditions are room temperature (23° C.±5° C.), a test force of 60 N, and a holding time of 4 seconds. Results thereof are shown in the "Rockwell hardness" column of Table 3.

[Evaluation of Cutting Tool]

<Cutting Test>

By using a PCB drill of each sample, a commercially available printed circuit board for a vehicle was subjected to drill working to evaluate the hole position accuracy. The drill working conditions were a rotation speed of 120 krpm, a feed speed of 0.2 m/min, and a drawing speed of 25 m/min. The number of drilled holes (the number of hits) when the hole position accuracy (ave+3σ (μm)) exceeded 70 μm was measured. Results thereof are shown in the "Cutting test" column of Table 3. The values in Table 3 are values obtained by rounding down the actual numbers of drilled holes to the nearest hundred. For example, when the actual number of drilled holes was 6250, 6200 was entered in the "Cutting test" column. A larger number of drilled holes shows a higher hole position accuracy of the cutting tool and a longer tool life thereof.

TABLE 3

| | Cemented carbide | | | | | | | |
|---|---|---|---|---|---|---|---|---|
| Sample No. | WC particle content % by volume | Binder phase content % by volume | WC particle + phase content % by volume | Co content in binder phase % by mass | First element type | First element content atomic % | Segregation of first element Presence/Absence | Rockwell hardness HRC | Cutting test Number of drilled holes hit |
| 1 | 64.0 | 18.0 | 82.0 | 85.0 | Ti | 5.40 | Absence | 91 | 6500 |
| 2 | 90.0 | 5.0 | 95.0 | 93.0 | Ti | 2.30 | Absence | 93 | 7400 |
| 3 | 84.0 | 8.0 | 92.0 | 70.0 | Ta | 7.30 | Absence | 92 | 6400 |
| 4 | 99.2 | 0.4 | 99.6 | 66.0 | Nb | 0.80 | Absence | 94 | 6600 |
| 5 | 74.0 | 13.0 | 87.0 | 52.0 | Zr | 3.60 | Absence | 93 | 7200 |
| 6 | 68.0 | 16.0 | 84.0 | 75.0 | Hf | 0.03 | Absence | 92 | 6200 |
| 7 | 70.0 | 15.0 | 85.0 | 79.0 | Mo | 6.80 | Absence | 92 | 6200 |
| 8 | 80.0 | 10.0 | 90.0 | 91.0 | Ti, Nb | 8.20 | Absence | 93 | 6500 |
| 9 | 88.0 | 6.0 | 94.0 | 88.0 | Ta, Zr | 9.00 | Absence | 93 | 6600 |
| 10 | 97.0 | 1.5 | 98.5 | 79.0 | Ti, Hf | 6.10 | Absence | 94 | 6400 |
| 11 | 68.0 | 16.0 | 84.0 | 83.0 | Nb, Mo | 7.70 | Absence | 92 | 6300 |
| 12 | 93.9 | 0.1 | 94.0 | 94.0 | Ti | 0.01 | Absence | 94 | 7900 |
| 13 | 77.0 | 20.0 | 97.0 | 50.0 | Ti | 10.00 | Absence | 90 | 6000 |
| 1-1 | 58.0 | 21.0 | 79.0 | 67.0 | Ti | 6.10 | Absence | 90 | 2900 |
| 1-2 | 100.0 | 0.0 | 100.0 | 79.0 | Ti | 7.20 | Absence | 94 | 4900 |
| 1-3 | 68.0 | 16.0 | 84.0 | 94.0 | Ti | 0.00 | Absence | 92 | 3600 |
| 1-4 | 78.0 | 11.0 | 89.0 | 52.0 | Ti | 10.40 | Absence | 93 | 4000 |
| 1-5 | 84.0 | 8.0 | 92.0 | 48.0 | Ti | 5.30 | Absence | 93 | 4200 |
| 1-6 | 90.0 | 5.0 | 95.0 | 66.0 | Ti | 6.50 | Presence | 93 | 3500 |
| 1-7 | 64.0 | 18.0 | 82.0 | 85.0 | Ti | 12.40 | Presence | 91 | 1600 |
| 1-8 | 64.0 | 18.0 | 82.0 | 85.0 | Ti | 11.00 | Presence | 91 | 1700 |

<Discussion>

The cemented carbides and cutting tools of sample 1 to sample 13 correspond to Examples. The cemented carbides and cutting tools of sample 1-1 to sample 1-8 correspond to Comparative Examples. It was confirmed that the cutting tools of sample 1 to sample 13 (Examples) had more excellent hole position accuracy and a longer tool life than the cutting tools of sample 1-1 to sample 1-8 (Comparative Examples). It is presumed that this is because the cemented carbides of sample 1 to sample 13 have excellent wear resistance and breakage resistance.

The embodiments and the Examples of the present disclosure have been described as above, and it is also planned from the beginning to appropriately combine the configurations of the embodiments and the Examples described above and to modify these in various ways.

The embodiments and the Examples disclosed this time should be considered to be illustrative in all respects and non-limiting. The scope of the present invention is defined by the Claims, not by the above embodiments and Examples, and is intended to include all modifications within the meaning and scope equivalent to the Claims.

REFERENCE SIGNS LIST 1 tungsten carbide particle; 2 binder phase; 3 cemented carbide; 10 cutting tool; 11 cutting edge.

The invention claimed is:

1. A cemented carbide comprising a plurality of tungsten carbide particles and a binder phase, wherein
the cemented carbide comprises a total of 80% by volume or more of the tungsten carbide particles and the binder phase,
the cemented carbide comprises 0.1% by volume or more and 20% by volume or less of the binder phase,
the cemented carbide comprises at least one first element selected from the group consisting of titanium, tantalum, niobium, zirconium, hafnium, and molybdenum,
the cemented carbide comprises a total of 0.01 atomic % or more and 10.0 atomic % or less of the first element,
the binder phase comprises 50% by mass or more of cobalt,
the first element is not segregated in a first interface region between the tungsten carbide particles adjacent to each other,
a first tungsten carbide particle and a second tungsten carbide particle that are the tungsten carbide particles adjacent to each other form a first interface,
the first interface region consists of a first A region in which a distance from the first interface approaching the first tungsten carbide particle is within 1.2 nm, and a first B region in which a distance from the first interface approaching the second tungsten carbide particle is within 1.2 nm,
the cemented carbide is prepared by:
preparing raw material powders;
mixing the raw material powders at predetermined proportions;
compacting the mixed powder into a shape for a cutting tool to obtain a compact;

sintering the compact by a sinter Hot Isostatic Pressing treatment; and cooling the sintered compact, the sinter Hot Isostatic Pressing treatment includes a first sintering step and a second sintering step, the first sintering step is performed at a sintering temperature of 1,300° C. and a sintering pressure of 7 MPa for 240 minutes, and the second sintering step is performed at a sintering temperature of 1,360° C. and a sintering pressure of 7 MPa for 15 minutes.

2. The cemented carbide according to claim 1, wherein a total content of the first element in the cemented carbide is 0.1 atomic % or more and 5 atomic % or less.

3. The cemented carbide according to claim 1, wherein the cemented carbide comprises 0.1% by volume or more and 18% by volume or less of the binder phase.

4. The cemented carbide according to claim 1, wherein a total content of the first element in the cemented carbide is 2.30 atomic % or more and 10.0 atomic % or less.

5. The cemented carbide according to claim 1, wherein a total content of the first element in the cemented carbide is 2.30 atomic % or more and 5 atomic % or less.

6. A cutting tool comprising a cutting edge formed from the cemented carbide according to claim 1.

\* \* \* \* \*